United States Patent
Ahn et al.

(10) Patent No.: US 8,404,529 B2
(45) Date of Patent: Mar. 26, 2013

(54) METHOD OF MANUFACTURING THIN FILM TRANSISTOR

(75) Inventors: Ji-Su Ahn, Yongin (KR); Sung-Chul Kim, Yongin (KR); Beong-Ju Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/431,630

(22) Filed: Mar. 27, 2012

(65) Prior Publication Data

US 2012/0184074 A1  Jul. 19, 2012

Related U.S. Application Data

(62) Division of application No. 12/588,973, filed on Nov. 4, 2009, now abandoned.

(30) Foreign Application Priority Data

Nov. 4, 2008  (KR) .................. 10-2008-0109044

(51) Int. Cl.
    *H01L 21/84* (2006.01)
(52) U.S. Cl. .................. 438/166; 257/E21.561
(58) Field of Classification Search .......... 438/151–166; 257/E21.561
    See application file for complete search history.

(56) References Cited

U.S. PATENT DOCUMENTS

| | | | |
|---|---|---|---|
| 4,933,296 A | 6/1990 | Parks et al. | |
| 5,156,986 A | 10/1992 | Wei et al. | |
| 5,362,660 A | 11/1994 | Kwasnick et al. | |
| 5,602,047 A | 2/1997 | Tsai et al. | |
| 6,197,624 B1 | 3/2001 | Yamazaki | |
| 7,838,880 B2 | 11/2010 | Kwak et al. | |
| 2007/0075313 A1 | 4/2007 | Kwak et al. | |
| 2009/0042342 A1 | 2/2009 | Ro et al. | |

FOREIGN PATENT DOCUMENTS

| | | |
|---|---|---|
| JP | 01-259322 | 10/1989 |
| JP | 06-317814 | 11/1994 |
| KR | 10-2007-0090849 A | 9/2007 |
| KR | 10-2007-0121421 A | 12/2007 |
| KR | 10-0822216 B1 | 4/2008 |
| WO | WO 2007/100233 A1 | 9/2007 |

*Primary Examiner* — Richard A. Booth

(74) *Attorney, Agent, or Firm* — Lee & Morse, P.C.

(57) ABSTRACT

A thin film transistor for an organic light emitting diode includes a substrate including a pixel portion and an interconnection portion, a buffer layer on the substrate, a gate electrode and a gate interconnection on the buffer layer, wherein the gate electrode is located at the pixel portion and the gate interconnection is located at the interconnection portion, a gate insulating layer on the substrate, a semiconductor layer on the gate electrode, source and drain electrodes electrically connected to the semiconductor layer, and a metal pattern on the gate interconnection.

6 Claims, 3 Drawing Sheets

METHOD OF MANUFACTURING THIN FILM TRANSISTOR

CROSS REFERENCE TO RELATED APPLICATION

This is a divisional application based on pending application Ser. No. 12/588,973, filed Nov. 4, 2009 now abandoned, the entire contents of which is hereby incorporated by reference.

BACKGROUND

1. Field

Non-limiting example embodiments relate to a thin film transistor ("TFT"), a method of manufacturing the same, and an organic light emitting diode ("OLED") display device including the same. More particularly, non-limiting example embodiments relate to a TFT, which can prevent generated Joule heating from generating an arc during a conventional crystallization process.

2. Related Art

Annealing methods used during a crystallization process generally include a furnace annealing method using a heat treatment furnace, a rapid thermal annealing ("RTA") method using radiant heat, e.g., a halogen lamp, etc., a laser annealing method using a laser, an annealing method using Joule heating, and so on. Among available annealing methods, an appropriate annealing method for the crystallization process is determined based on characteristics of material and process contemplated. Some of the factors to be considered in the selection of an appropriate annealing method are a range of an annealing temperature, uniformity of the annealing temperature, a heating rate, a cooling rate, purchase price, and maintenance cost. A selection of annealing method, however, becomes very limited when high temperature annealing or high rate annealing only in a local region of a material is needed.

While the laser annealing can rapidly anneal a surface of a material, the laser annealing method has only limited applicability since the applicability of the heat treatment is determined by a wavelength of a laser and the kind of materials requiring the heat treatment. In particular, when scanned linear laser beams overlap to anneal a large-sized device, non-uniformity in intensity of the laser beam and in irradiation level of the laser beam may occur. In addition, the laser annealing method requires expensive equipment, and thus, increasing maintenance cost.

The RTA method is widely applied to a semiconductor manufacturing process. With current technology, however, RTA method can be applied only to a silicon wafer having a diameter of 300 mm or less. The RTA method cannot be applied to a silicon wafer having a diameter larger than 300 mm because RTA method cannot uniformly anneal the silicon wafer having a diameter larger than 300 mm. Further, since a maximum heating rate of the heat treatment is 400° C./sec, it is hard to use the RTA method in a process requiring a higher heating rate than 400° C./sec.

Therefore, researches have been widely conducted on annealing methods to solve these problems and to eliminate processing limitations.

SUMMARY

Non-limiting example embodiments are therefore directed to a TFT, a method of manufacturing the same, and an OLED display device including the same, which substantially overcome one or more of the disadvantages of the related art.

It is therefore a feature of a non-limiting example embodiment to provide a TFT capable of preventing an arc formation during the crystallization of an amorphous silicon layer as the result of a metal layer conducting heat.

At least one of the above features and other advantages may be realized by providing a TFT including a substrate having a pixel portion and an interconnection portion, a buffer layer on the substrate; a gate electrode and a gate interconnection on the buffer layer, wherein the gate electrode is located at the pixel portion and the gate interconnection is located at the interconnection portion, a gate insulating layer on the entire substrate, a semiconductor layer on the gate electrode, source and drain electrodes electrically connected to the semiconductor layer, and a metal pattern disposed on the gate interconnection.

The metal pattern and the source and drain electrodes may include the same material. The source and drain electrodes and the metal pattern may include one or more of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a molybdenum (Mo) alloy, an aluminum (Al) alloy, and a copper (Co) alloy. These may be used alone or in a combination thereof.

The TFT may further include an impurity-doped silicon layer formed between the semiconductor layer and the source and drain electrodes. An insulating layer may be formed on the gate insulating layer. The gate interconnection may be in direct contact with the metal pattern.

The TFT may further include the semiconductor layer, which may be a polysilicon layer.

At least one of the above features and other advantages may be realized by providing a method of manufacturing a thin film transistor, the method including providing a substrate having a pixel portion and a peripheral portion, forming a buffer layer on the substrate, forming a gate electrode and a gate interconnection on the buffer layer, wherein the gate electrode is located at the pixel portion and a gate interconnection is located at the peripheral portion, forming a gate insulating layer on the gate electrode and the gate interconnection, forming an amorphous semiconductor layer and patterning the amorphous semiconductor layer to form a semiconductor layer pattern on the gate electrode of the pixel portion, forming a metal layer on the substrate to be electrically connected to the semiconductor layer pattern and the gate interconnection, applying an electric field to the metal layer to crystallize the semiconductor layer pattern to form a semiconductor layer, and patterning the metal layer to form source and drain electrodes electrically connected to the semiconductor layer of the pixel portion and a metal pattern on the gate interconnection.

The metal pattern may be in direct contact with the gate interconnection.

The electric current may be generated by applying an electrical field of about 100 V/cm$^2$ to about 10,000 V/cm$^2$ to the metal layer.

The metal layer may be formed on the substrate to a thickness of about 50 nm to about 200 nm. The metal layer may include one or more of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a molybdenum (Mo) alloy, an aluminum (Al) alloy, and a copper (Co) alloy. These may be used alone or in a combination thereof.

The impurity-doped silicon layer may be formed between the semiconductor layer and the source and drain electrodes.

At least one of the above features and other advantages may be realized by providing an OLED display device, including OLEDs configured to emit light, and TFTs coupled to the OLEDs, each TFT including a substrate having a pixel portion and an interconnection portion, a buffer layer on the substrate, a gate electrode and a gate interconnection portion on the buffer layer, wherein the gate electrode is located at the pixel portion and the gate interconnection is located at the interconnection portion, a gate insulating layer on the substrate, a semiconductor layer on the gate electrode, source and drain electrodes electrically connected to the semiconductor layer, an insulating layer on the substrate, a first electrode, source and drain electrodes, an organic layer and a second layer on the insulating layer, wherein the first electrode is electrically connected to the source and drain electrodes, the organic layer and the second layer, and a metal pattern on the gate interconnection.

The metal pattern may include the same material as the source and drain electrodes. The source and drain electrodes and the metal pattern may include one or more of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a molybdenum (Mo) alloy, an aluminum (Al) alloy, and a copper (Co) alloy. These may be used alone or in a combination thereof.

The OLED display device may further include an impurity-doped silicon layer between the semiconductor layer and the source and drain electrodes. The semiconductor layer may be a polysilicon layer.

The OLED display device may further include an insulating layer on the gate insulating layer.

The gate interconnection may be in direct contact with the metal pattern.

BRIEF DESCRIPTION OF THE DRAWINGS

Non-limiting example embodiments of the present invention will be described more apparently with reference to the attached drawings, in which.

DETAILED DESCRIPTION

Figure 1A:
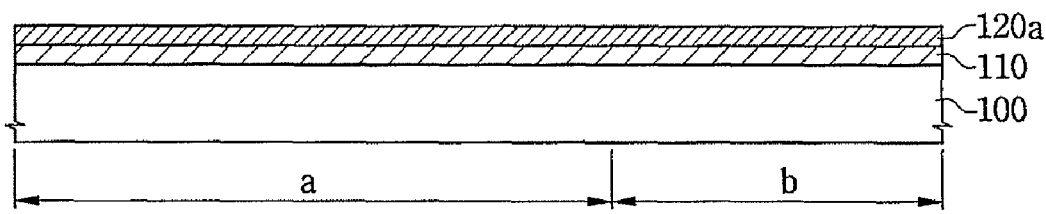
FIGS. 1A to 1E illustrate cross-sectional views of stages in a method of manufacturing a TFT in accordance with a non-limiting example embodiment of the present invention.

Korean Patent Application No. 10-2008-0109044, filed on Nov. 4, 2008, in the Korean Intellectual Property Office, and entitled: "Thin Film Transistor, Method of Manufacturing the Same, and Organic Light Emitting Diode Display Device Including the Same," is incorporated by reference herein in its entirety.

Non-limiting example embodiments will now be described more fully hereinafter with reference to the accompanying drawings; however, they may be embodied in different forms and should not be construed as limited to the non-limiting example embodiments set forth herein. Rather, these non-limiting example embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

<Non-Limiting Example Embodiments>

FIGS. 1A to 1E illustrate cross-sectional views of stages in a method of manufacturing a TFT in accordance with a non-limiting example embodiment of the present invention.

Referring to FIG. 1A, a substrate 100 including a pixel portion a and an interconnection portion "b" is prepared, and a buffer layer 110 is formed on the substrate 100. The substrate 100 may include, e.g., a transparent material such as glass or plastic. The buffer layer 110 may prevent or reduce diffusion of moisture or impurities generated from the substrate 100, and/or may adjust a heat transfer rate during crystallization to facilitate crystallization of the amorphous silicon layer. The buffer layer 110 may be formed in a single layer or in a multi-layer structure including an insulating layer, e.g., a silicon oxide layer or a silicon nitride layer.

Then, a gate electrode metal layer 120a may be formed on the buffer layer 110. The gate electrode metal layer 120a may be a single layer including aluminum or an aluminum alloy, e.g., aluminum-neodymium (Al—Nd), or a multi-layer in which an aluminum alloy is deposited on a chromium (Cr) or molybdenum (Mo) alloy. These may be used alone or in a combination thereof.

Figure 1B:
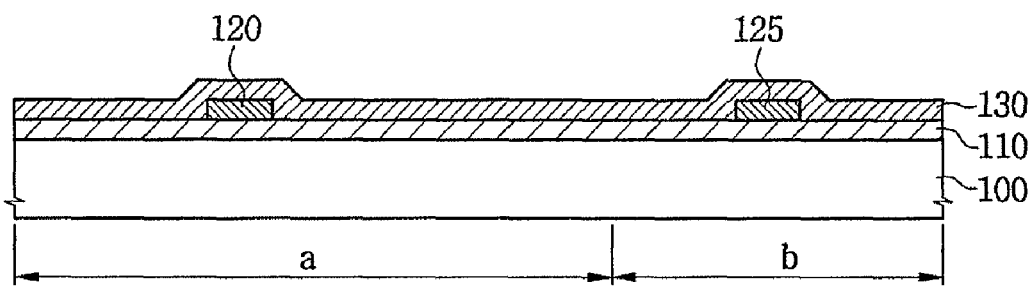

Referring to FIG. 1B, the gate electrode metal layer 120a is patterned to form a gate electrode 120 located at the pixel portion of the substrate 100 and a gate interconnection 125 located at the interconnection portion "b" of the substrate 100.

A gate insulating layer 130 may be formed on the substrate 100. The gate insulating layer 130 may be a silicon oxide layer, a silicon nitride layer, or a combination thereof.

Figure 1C:
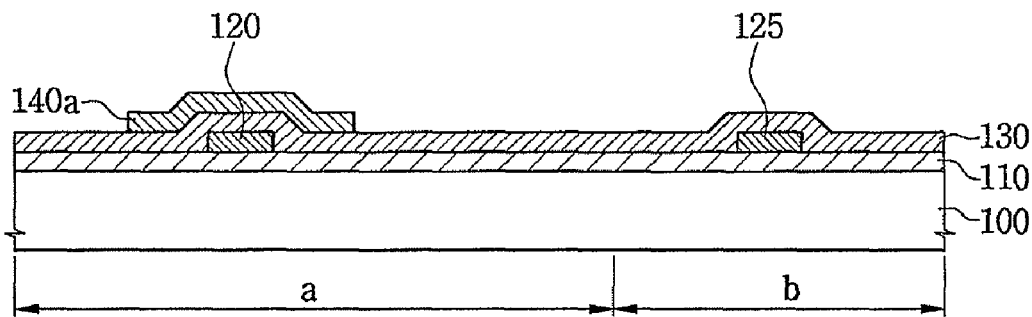

Referring to FIG. 1C, an amorphous semiconductor layer 140' (not shown), e.g., amorphous silicon, may be formed on the substrate 100 having the gate electrode 120, and then, patterned to form a semiconductor layer pattern 140a corresponding to the gate electrode 120.

Figure 1D:
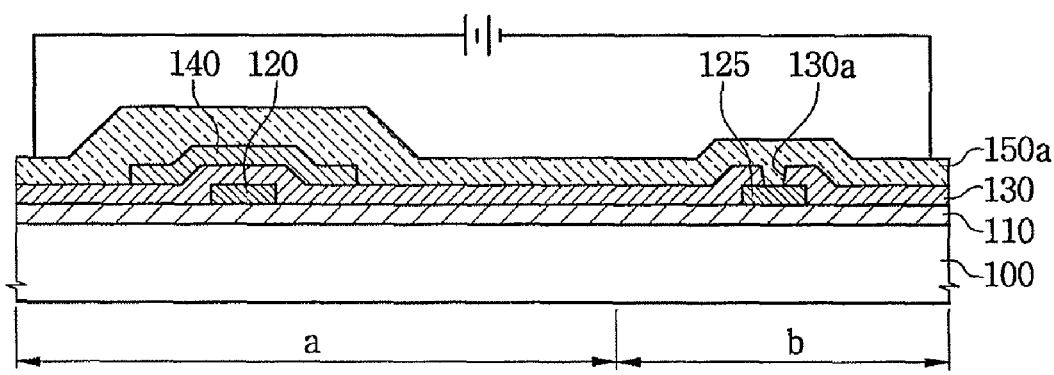

Referring to FIG. 1D, a portion of the gate insulating layer 130 in the interconnection portion "b" of the substrate may be removed to form an opening 130a to partially expose the gate interconnection 125.

A metal layer 150a may be formed on the substrate 100. Then, an electric field is applied to heat the metal layer 150a.

As the result, heat of the heated metal layer 150a is transferred to crystallize the semiconductor layer pattern 140a formed using an amorphous semiconductor layer (not shown) disposed thereunder, and a semiconductor layer 140 is thereby formed of, e.g., a polysilicon.

As described above, since the metal layer 150a is directly connected to the semiconductor layer 140, it is more advantageous to crystallization. In addition, since the metal layer 150a is directly connected to the gate interconnection 125, it is possible to prevent generation of arc during crystallization and reduce defective goods.

At this time, in order to smoothly perform the crystallization, an electric field of about 100 V/cm$^2$ to about 10,000 V/cm$^2$ is applied for about 1 μsec to about 1 sec. The electric field of less than about 100 V/cm$^2$ may not generate sufficient current for Joule heating to perform crystallization, while the electric field of more than about 10,000 V/cm$^2$ may generate a local arc. In addition, when the electric field is applied for less than about 1 μsec, the crystallization may not be readily performed due to the insufficient Joule heating. When the electric field is applied for more than about 1 sec, so much heat may be generated that the substrate may be bent, or may form a defect along the edge as heat transfers during crystallization.

Figure 1E:
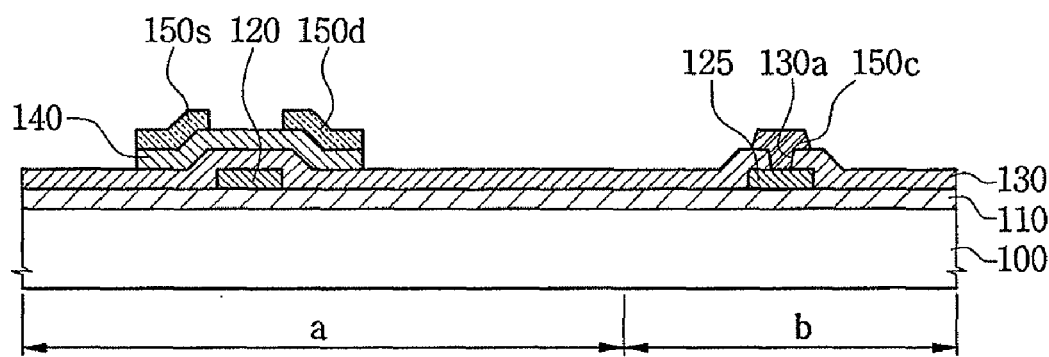

Referring to FIG. 1E, after formation of the semiconductor layer 140 of the polysilicon layer through the crystallization is completed; the metal layer 150a may be patterned to form source and drain electrodes 150s and 150d. During the process, metal pattern 150c may remain in the opening 130a and connected to the gate interconnection 125 in the interconnection portion "b" of the substrate.

A silicon layer (not shown) doped with N-type or P-type impurities may be further disposed between the semiconductor layer 140 and the source and drain electrodes 150s and 150d.

In general, the metal layer 150a may have a thickness sufficient to form the source and drain electrodes 150s and 150d, preferably, about 50 nm to about 200 nm. When the thickness is less than about 50 nm, the metal layer 150a may not be uniformly formed, and thus, heat transfer may not be even, resulting uneven crystallization. When the thickness of the metal layer 150a is greater than about 200 nm, the source and drain electrodes 150s and 150d may not be thick enough for a thin film device. Therefore, when the layer 150a is patterned to form the source and drain electrodes, the electrode having a thickness of 200 nm or less, but greater than 50 nm, is appropriate for an electrode used in a TFT.

The metal layer 150a may include one or more of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a molybdenum (Mo) alloy, an aluminum (Al) alloy, and a copper (Co) alloy. These may be used alone or in a combination thereof.

Therefore, the TFT in accordance with a non-limiting example embodiment of the present invention is completed.

Figure 2:
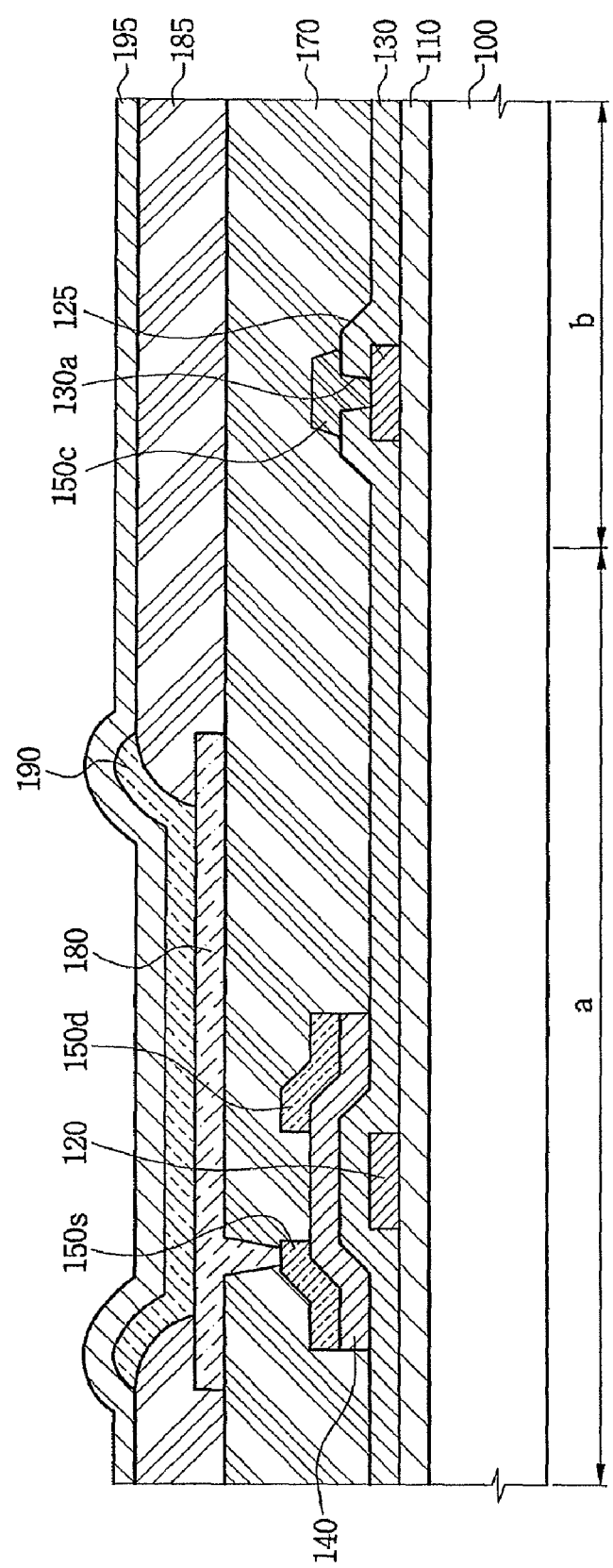
FIG. 2 illustrates a cross-sectional view of an OLED display device in accordance with a non-limiting example embodiment of the present invention.

FIG. 2 illustrates a cross-sectional view of an OLED device having a TFT in accordance with a non-limiting example embodiment of the present invention.

Referring to FIG. 2, an insulating layer 170 may be formed on the substrate 100 including the TFT formed in accordance with the non-limiting example embodiment described in FIG. 1E. The insulating layer 170 may be an inorganic layer, e.g., a silicon oxide layer, a silicon nitride layer, and silicate on glass, or an organic layer, e.g., polyimide, benzocyclobutene series resin, and acrylate. In addition, the insulating layer 170 may be formed in a stacked structure of the inorganic layer and the organic layer.

The insulating layer 170 may be etched to form a via-hole exposing the source or drain electrode 150s or 150d. A first electrode 180 may be connected to one of the source and drain electrodes 150s and 150d through the via-hole. The first electrode 180 may be an anode or a cathode. When the first electrode 180 is an anode, the anode may be a transparent conductive layer including, e.g., indium tin oxide (ITO), indium zinc oxide (IZO), or indium tin zinc oxide (ITZO). When the first electrode 180 is a cathode, the cathode may include, e.g., Mg, Ca, Al, Ag, Ba, or an alloy thereof. These may be used alone or in a combination thereof.

A pixel defining layer 185 having an opening exposing a portion of the surface of the first electrode 180 may be formed on the first electrode 180, and an organic layer 190 including an emission layer is formed on the exposed first electrode 180. The organic layer 190 may further include at least one of a hole injection layer, a hole transport layer, a hole blocking layer, an electron blocking layer, an electron injection layer, and an electron transport layer. Then, a second layer 195 may be formed on the organic layer 190, thereby completing an OLED display device in accordance with a non-limiting example embodiment of the present invention.

Using a rapid annealing method that applies an electrical field to a conductive layer and generates Joule heat, it may be possible to rapidly anneal a selected material by transferring high heat. This is desirable, as the rapid annealing method may have a much higher heating rate than that of the conventional RTA method. Such a rapid annealing method, however, may introduce physical defects to the substrate from an arc generated during the Joule heating. Thus, according to non-limiting example embodiments, as the result of a metal layer being directly connected to the gate interconnection, an occurrence of an arc caused by Joule heat during the crystallization operation may be prevented. Thus, defects may be reduced, and production yield may be improved.

Non-limiting example embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a thin film transistor, the method comprising:
    providing a substrate having a pixel portion and a peripheral portion;
    forming a buffer layer on the substrate;
    forming a gate electrode and a gate interconnection on the buffer layer, the gate electrode being located at the pixel portion, the gate interconnection being located at the peripheral portion;
    forming a gate insulating layer on the gate electrode and the gate interconnection;
    forming an amorphous semiconductor layer and patterning the amorphous semiconductor layer to form a semiconductor layer pattern on the gate electrode of the pixel portion;
    forming a metal layer on the substrate to be electrically connected to the semiconductor layer pattern and the gate interconnection;

applying an electric field to the metal layer to crystallize the semiconductor layer pattern to form a semiconductor layer; and patterning the metal layer to form source and drain electrodes electrically connected to the semiconductor layer of the pixel portion and a metal pattern on the gate interconnection.

2. The method of claim 1, wherein the metal pattern is in direct contact with the gate interconnection.

3. The method of claim 1, wherein the crystallization is performed by applying the electric field of about 100 V/cm$^2$ to about 10,000 V/cm$^2$ to the source/drain electrode metal layer.

4. The method of claim 1, wherein the metal layer is formed on the substrate to a thickness of about 50 nm to about 200 nm.

5. The method of claim 1, wherein the metal layer includes at least one of molybdenum, chromium, tungsten, molybdenum-tungsten, aluminum, aluminum-neodymium, titanium, titanium nitride, copper, a molybdenum alloy, an aluminum alloy, and a copper alloy.

6. The method of claim 1, further comprising forming an impurity-doped silicon layer between the semiconductor layer and the source and drain electrodes.

* * * * *